United States Patent
Ootuka et al.

(10) Patent No.: US 6,618,448 B1
(45) Date of Patent: Sep. 9, 2003

(54) DC RECOVERY CIRCUIT CAPABLE OF RECEIVING ECL SIGNAL EVEN UNDER LOW POWER SUPPLY VOLTAGE

(75) Inventors: Shigeo Ootuka, Kanagawa (JP); Ryo Tamaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/306,390

(22) Filed: May 6, 1999

(30) Foreign Application Priority Data

May 11, 1998 (JP) .......................................... P10-126974

(51) Int. Cl.$^7$ .............................................. H04L 25/06
(52) U.S. Cl. ....................................................... 375/319
(58) Field of Search ................................. 375/316, 317, 375/318, 319; 327/574, 489

(56) References Cited

U.S. PATENT DOCUMENTS 5,469,305 A * 11/1995 Madsen et al. ................ 360/51

FOREIGN PATENT DOCUMENTS

| EP | 0 320 022 A2 | 6/1989 |
| EP | 0 510 976 A2 | 10/1992 |
| EP | 0 611 059 A2 | 8/1994 |

* cited by examiner

Primary Examiner—Chi Pham
Assistant Examiner—Kevin M. Burd
(74) Attorney, Agent, or Firm—Rader, Fishman & Grauer PLLC; Ronald P. Kananen, Esq.

(57) ABSTRACT

When an input unit amplifier is employed in which transistors are longitudinally stacked in order that an input amplitude of a quantizing feedback circuit is made coincident with an output amplitude thereof, this quantizing feedback circuit cannot receive an ECL signal having a large amplitude under low power supply voltage. In a DC recovery circuit for correcting a shift contained in a DC level of an input signal by employing a quantizing feedback circuit having an adder, a comparator, and low-pass filters, a DC level of an input signal of the quantizing feedback circuit is compared with a DC level of an output signal thereof by an AGC circuit. A control signal corresponding to a level difference of these DC levels is supplied to a variable current source of a differential amplifier which constitutes a comparator so as to control a current of this variable current source. As a result, the amplitude of the output signal of the quantizing feedback circuit can be made coincident with the amplitude of the input signal thereof.

10 Claims, 4 Drawing Sheets

BIAS LEVEL

DC RECOVERY CIRCUIT CAPABLE OF RECEIVING ECL SIGNAL EVEN UNDER LOW POWER SUPPLY VOLTAGE

BACKGROUND OF THE INVENTION

1. Field of the Invention

The present invention is related to a DC recovery circuit for correcting a shift or deviation contained in a direct current level (will be referred to as a "DC level" hereinafter) of a digital signal entered by way of a capacitor coupling.

2. Description of the Related Art

In a serial data transmission system, a clock data recovery circuit is provided in an input stage of a data reception unit thereof in order to correctly receive serial data which is transmitted via a transmission line. This clock data recovery circuit produces a recovery clock having a constant time period in synchronism with the serial data, and again correctly sets timing of the serial data based upon this produced recovery clock to thereby output the correctly set serial data as retimed data.

For example, assuming now that in a data reception unit equipped with this clock data recovery circuit as an input stage, a power supply voltage is selected to be 3.3 V and a level PECL of an internal signal (plus power supply ECL) is selected to be 200 mVpp, the normal ECL (emitter-coupled logic) signal cannot be directly entered into this data reception unit. Therefore, in order that the serial data corresponding to the ECL signal can be entered, this serial data transmission system employs the below-mentioned arrangement.

In other words, as indicated in FIG. 1, an ECL signal outputted from an ECL circuit (IC) 101 which is operated under a minus power supply Vss (for example, −4.5 V) is inputted via an attenuator 102 and a coupling capacitor 103 to a data reception unit (IC) 104. Furthermore, a shift (deviation) contained in the DC level is corrected by a DC recovery circuit 105 arranged at an input stage of this data reception circuit 104.

It should be noted that in the data reception circuit 104, serial data corresponding to such an ECL signal whose DC level is corrected by the DC recovery circuit 105 is supplied to both a PLL (phase-locked loop) circuit 106 and a re-timing circuit 107. Both this PLL circuit 106 and the re-timing circuit 107 will constitute the clock data recovery circuit. Then, the recovery clock is produced by the PLL circuit 106, and the timing of the received serial data is again set by the re-timing circuit 107 based upon the recovery clock so as to be outputted as retimed data.

On the other hand, when a digital signal is entered by way of a capacitor coupling manner, as indicated in FIG. 2A, an amplitude center level of the digital signal would be shifted with respect to a DC center level (bias level), as represented in FIG. 2B, depending upon the mark ratio of the data corresponding to a ratio of High (logic signal 1) to Low (logic signal 0). To correct the shift of the DC level of this signal (b), as shown in FIG. 3, a quantizing feedback circuit is employed. This quantizing feedback circuit is arranged by an input circuit 111; an adder 112 for entering the output of this input circuit 111 as one input thereof; a comparator 113 for judging a logic state of an added output from this adder 112, namely for judging High/Low; and a low-pass filter 114 for feeding a DC component of the output from this comparator 113 back to the adder 112 as another input thereof.

This quantizing feedback circuit may correct the shift contained in the DC level of the input signal in such a manner that a DC component of an output signal is extracted from an amplitude of this output signal by the low-pass filter 114, and this extracted DC component is fed back to the adder 112 as another input thereof in order to be added to the input signal. To correctly operate this quantizing feedback circuit, the amplitude of the input signal for this quantizing feedback circuit is required to be equal to that of the output signal from this quantizing feedback circuit.

In FIG. 4, there is shown an arrangement of a conventional DC recovery circuit with using a quantizing feedback circuit. This DC recovery circuit is arranged by employing an input unit amplifier 121, a quantizing feedback circuit 122 for correcting a DC level of an output signal derived from this input unit amplifier 121, an AGC (automatic gain control) circuit 123 for controlling an amplitude of the output signal derived from the input unit amplifier 121, and also a reference amplifier 124 for supplying a reference signal to this AGC circuit 123.

In the DC recovery circuit with employment of the above-explained circuit arrangement, when the amplitude of the output signal of the quantizing feedback circuit 122 is set to 200 mVpp for the next-staged circuit, a signal having the same amplitude (200 mVpp) must be entered as the input signal of the quantizing feedback circuit 122. To this end, both the amplitude (200 mVpp) of the reference signal and the amplitude of the input signal of the quantizing feedback circuit 122 are detected, and then a signal used to control the amplitudes is produced in the AGC circuit 123. Based on this control signal, the amplitude of the input signal is controlled to be 200 mVpp in the input unit amplifier 121, and then the amplitude-controlled input signal is outputted.

Since the above-described conventional DC recovery circuit is arranged in such a manner that the gain of the input unit amplifier 121 is controlled by the control signal of the AGC circuit 123 so as to execute the AGC (automatic gain control) with respect to the input signal, and therefore, the amplitude of the input signal to the quantizing feedback circuit 122 is made coincident with the amplitude of the output signal thereof, it is required to employ the input unit amplifier 121 having such a wider dynamic range than that of the input signal in order to accept this input signal having the large amplitude.

However, as apparent from one example of the circuit arrangement of this input unit amplifier 121 shown in FIG. 5, both a transistor portion thereof to which an AGC input is applied and another transistor portion thereof to which a signal is inputted may constitute a so-called "longitudinally stacked" structure between the power supply Vcc and the ground (GND). As a result, in such a case that the voltage of this power supply Vcc is low, for instance, 3.3 V, there is a limitation to widen the dynamic range of the input unit amplifier 121. As a consequence, this input unit amplifier 121 can hardly accept such an ECL signal whose amplitude is large.

SUMMARY OF THE INVENTION

The present invention has been made to solve the above-described problems, and therefore, has an object to provide a DC recovery circuit capable of receiving an ECL signal even under low power supply voltage.

A DC recovery circuit, according to the present invention, is featured by comprising: adding means for inputting thereinto a digital signal entered via a coupling capacitor as one input of the adding means; comparing means for judging a logic state of an output signal of the adding means; extracting means for extracting a DC component of the output signal from the comparing means to enter the extracted DC component to another input of the adding means; and control means for controlling the comparing means in order that an amplitude of the output signal from the comparing means is made coincident with an amplitude of the one input signal of the adding means.

In the DC recovery circuit with the above-described circuit arrangement, the extracting means extracts the DC component of the output signal of the comparing means by processing this signal. The DC component constitutes another input of the adding means, and is added to one input of the adding means by this adding means. As a result, the DC recovery circuit corrects the shift contained in the DC level of the input signal. At this time, the control means controls the comparing means in such a manner that the amplitude of the output signal of this comparing means is made coincident with the amplitude of one input signal of the comparing means.

BRIEF DESCRIPTION OF THE DRAWINGS

The present invention may be understood with reference to a detailed description to be read in conjunction with the accompanying drawings, in which:

FIG. 2. having

DETAILED DESCRIPTION OF THE PREFERRED EMBODIMENTS

Figure 6:
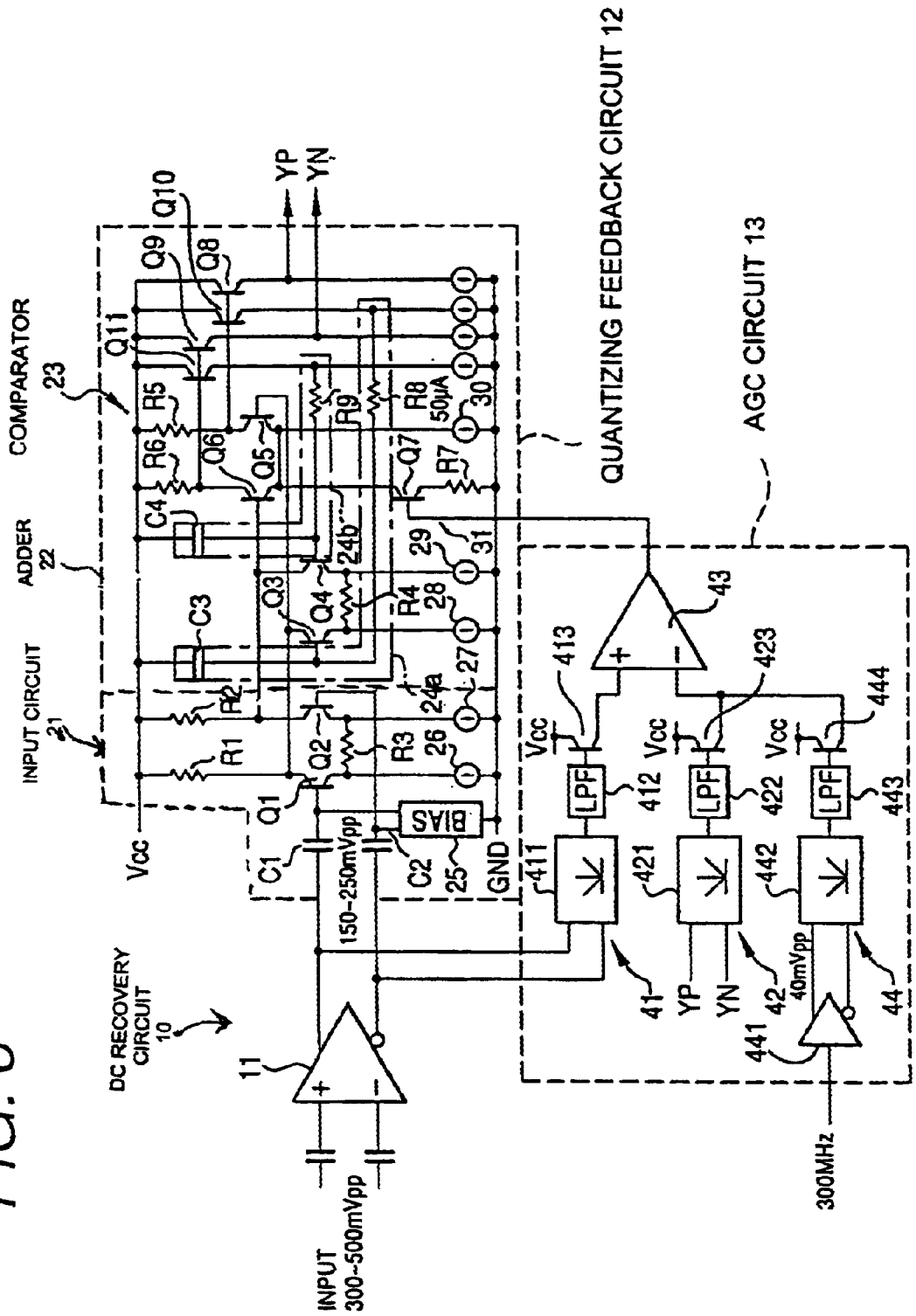
FIG. 6 is a circuit block diagram for indicating an embodiment mode of the present invention.

Referring now to drawings, embodiment modes of the present invention will be described in detail. FIG. 6 is a circuit block diagram for indicating one embodiment mode of the present invention.

A DC recovery circuit 10, according to this embodiment mode, is such a circuit for converting an ECL signal having an amplitude of, for instance, 300 to 500 mVpp into an internal PECL signal having a level of 200 mVpp. This ECL signal is inputted in a capacitor or capacitance coupling manner. As apparent from FIG. 6, the DC recovery circuit 10 is arranged by three circuits, namely a linear amplifier circuit 11, a quantizing feedback circuit 12, and an AGC circuit 13.

Figure 1:
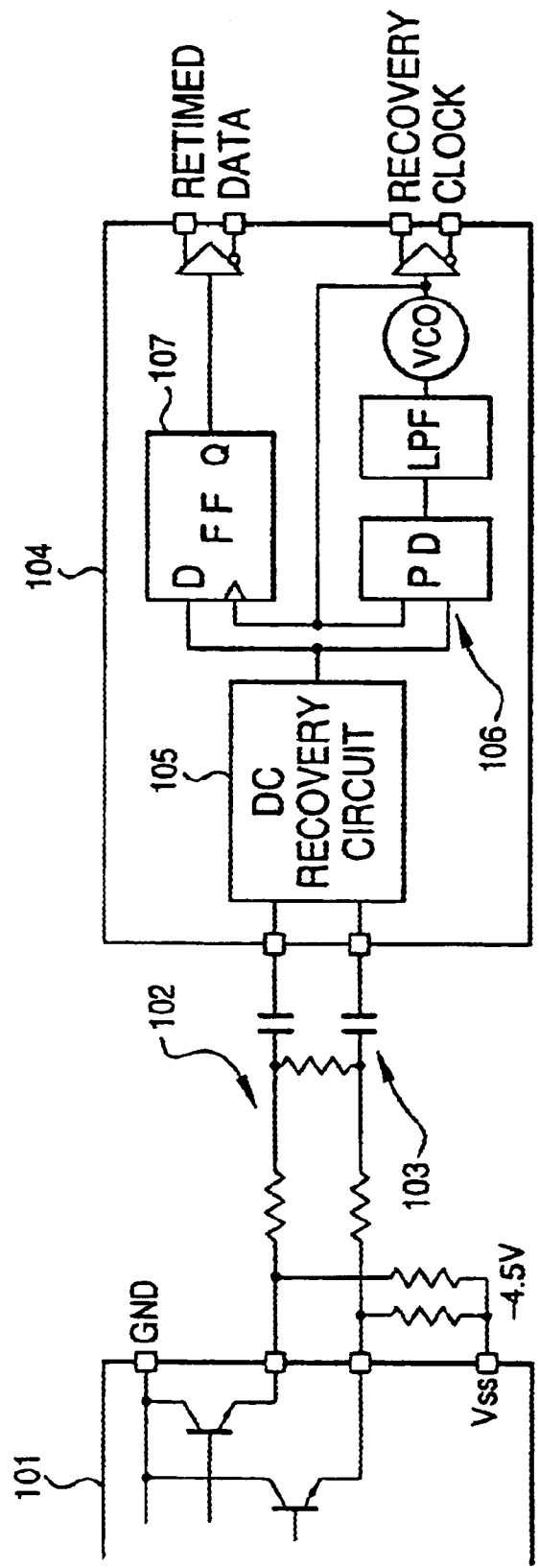
FIG. 1 is a structural circuit for showing an example of a transmission system of serial data.
Figure 2A:
FIGS. 2A and 2B, is a waveform diagram for representing a capacitor coupling waveform of a digital signal.
Figure 2B:
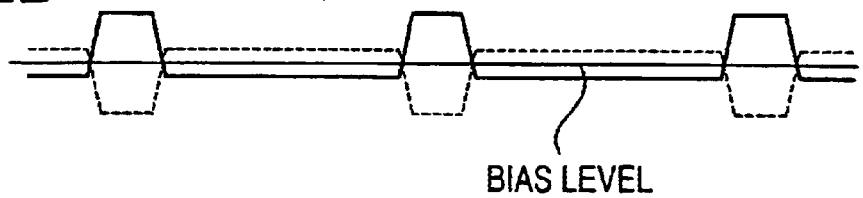
Figure 3:
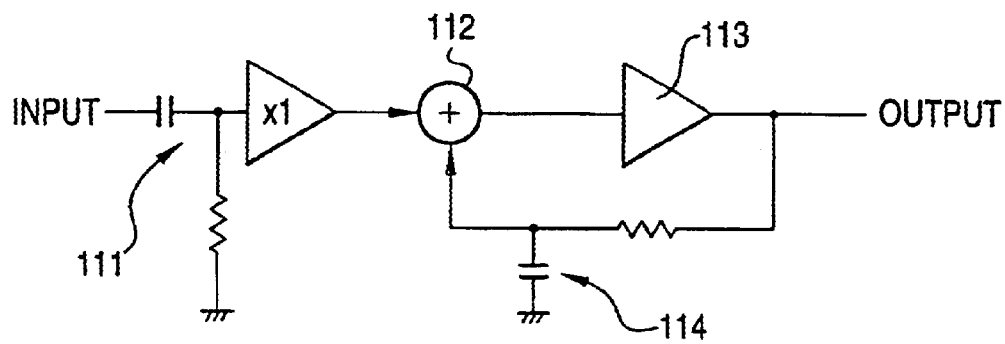
FIG. 3 is a block diagram for representing a basic arrangement of a quantizing feedback circuit.
Figure 4:
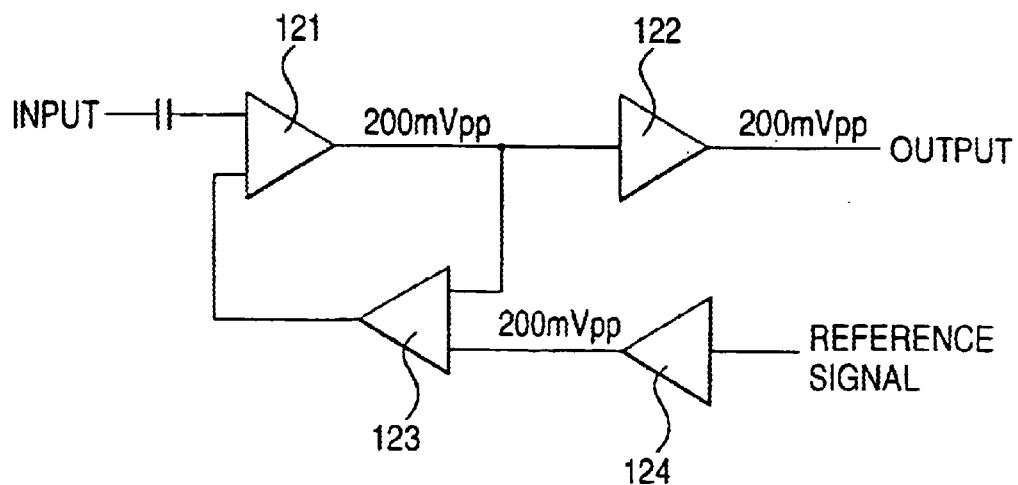
FIG. 4 is a block diagram for indicating the conventional DC recovery circuit.

On the other hand, as previously stated, if a digital signal is directly inputted via the capacitor coupling manner into the DC recovery circuit 10, then an amplitude center level of the signal would be shifted, or deviated with respect to a DC center level due to a mark ratio of the signal (see FIG. 2(b)), and a dynamic range approximated to 1 V is required with respect to a differential signal having an amplitude of, for example, 500 mVpp. The linear amplifier circuit 11 is employed so as to make a half amplitude of this signal.

In other words, the linear amplifier circuit 11 corresponds to such a differential amplifier circuit having a ½ gain, for converting an input signal having an amplitude of 300 to 500 mVpp into a signal having an amplitude of, for example, 150 to 250 mVpp. An input dynamic range of this differential amplifier circuit is selected to be on the order of 1.2 V. The signal whose amplitude has been converted by this linear amplifier circuit is supplied to both the quantizing feedback circuit 12 and the AGC circuit 13.

The quantizing feedback circuit 12 is arranged by an input circuit 21, an adder 22, a comparator 23, and low-pass filters 24a and 24b. This quantizing feedback circuit 12 is arranged in such a manner that a DC level which is extracted from an amplitude of an output signal from the comparator 23 by the low-pass filters 24a and 24b is added to an input signal by the adder 22 in order to correct a shift, or deviation contained in the DC level of the input signal. Also, this quantizing feedback circuit 12 controls such that a current of a current source of a differential amplifier which constitutes the comparator 23 is changed based upon the control signal supplied from the AGC circuit 13 so as to make the amplitude of the output signal coincident with the amplitude of the input signal.

Now, a description will be made of concrete circuit arrangements as to the input circuit 21, the adder 22, the comparator 23, and the low-pass filters 24a and 24b.

First, the input circuit 21 is constituted by capacitors C1 and C2 each having one terminal to which signals with phases opposite to each other are supplied from the linear amplifier circuit 11; transistors Q1 and Q2, the bases of which are connected to the respective other terminals of these capacitors C1 and C2; and a bias circuit 25 for biasing the respective bases of these transistors Q1 and Q2. The input circuit 21 is further arranged by resistors R1 and R2 connected between each of the collectors of the transistors Q1 and Q2 and the power supply Vcc; a resistor R3 connected between an emitter of the transistor Q1 and an emitter of the transistor Q2; and also constant current sources 26 and 27 connected between the respective emitters of the transistors Q1, Q2 and the ground (GND). Then, signals having phases opposite to each other are outputted from the transistors Q1 and Q2.

The adder 22 is arranged by transistors Q3 and Q4 each having collectors to which signals having phases opposite to each other are supplied from the input circuit 21; a resistor R4 connected between an emitter of the transistor Q3 and an emitter of the transistor Q4; and also constant current sources 28 and 29 connected between the respective emitters of the transistors Q3 and Q4, and the ground. This adder circuit 22 is so arranged that the DC levels which are extracted from the amplitude of the output signal from the comparator 23 extracted by the low-pass filters 24a and 24b are supplied to the respective bases of the transistors Q3 and Q4. The respective outputs of the collectors of the transistors Q3 and Q4 constitute adder outputs.

The comparator 23 is arranged by such a differential amplifier structure. That is, this differential amplifier is constituted by a differential pair of transistors Q5 and Q6 whose emitters are commonly connected to each other; resistors R5 and R6 connected between the respective collectors of these transistors Q5 and Q6 and the power supply Vcc; a constant current source 30 connected between the respective emitters of the transistors Q5 and Q6, and the ground; and a variable current source 31 made of a transistor Q7 and a resistor R7, which are series-connected between the respective emitters of the transistors Q5 and Q6, and also the ground. The control signal is supplied from the AGC circuit 13 to the base of the transistor Q7.

In this comparator 23, since the control signal outputted from the AGC circuit 13 is supplied to the base of the controlling transistor Q7 which constitutes the variable current source 31, this controlling transistor Q7 controls the current flowing through the variable current source 31 in response to this control signal, so that the amplitude of the output signal from the quantizing feedback circuit 12 can be made coincident with the amplitude of the input signal thereof. It should be noted that the constant current source 30 is connected in parallel to the variable current source 31 in order that the amplitude of the output signal does not disappear, and may supply a constant current having a value of on the order of 50 $\mu$A.

The comparator outputs having opposite phases to each other, derived from the comparator 23, namely the respective collector outputs of the differentially-paired transistors Q5 and Q6 are conducted through transistors Q8 and Q9 functioning as an emitter follower as output signals YP and YN of the quantizing feedback circuit 12, and furthermore, are supplied through transistors Q10 and Q11 functioning as another emitter follower to the low-pass filters 24a and 24b. The low-pass filters 24a and 24b extract the DC levels from the output signals YP and YN of the comparator 23, and then enter these extracted DC levels to the bases of the transistors Q3 and Q4 of the adder 22.

The low-pass filter 24a is arranged by a resistor R7 and a capacitor C3. The resistor R8 is connected between the emitter of the transistor Q10 and the base of the transistor Q3 of the adder 22. The capacitor C3 is connected between the base of this transistor Q3 and the power supply Vcc. On the other hand, the low-pass filter 24b is arranged by a resistor R8 and a capacitor C4. The resistor R9 is connected between the emitter of the transistor Q1 and the base of the transistor Q4 of the adder 22. The capacitor C4 is connected between the base of this transistor Q4 and the power supply Vcc.

As previously explained, in the quantizing feedback circuit 12 containing the adder 22, the comparator 23, and the low-pass filters 24a and 24b, since the output signal derived from the comparator 23 is filtered by the low-pass filters 24a and 24b, the DC level is extracted from the amplitude of this output signal. Then, this extracted DC level is fed back to the adder 22 so as to be added to the input signal, so that the shift contained in the DC level of the input signal can be corrected.

Also, both the output signals, YP and YN of the quantizing feedback circuit 12 are supplied to the AGC circuit 13. The AGC circuit 13 is arranged by employing a first DC level detecting circuit 41, a second DC level detecting circuit 42, and a differential amplifier 43. The first DC level detecting circuit 41 detects the output signal derived from the linear amplifier circuit 11, namely the DC level of the input signal entered into the quantizing feedback circuit 12. The second DC level detecting circuit 42 detects the DC level of the output signal derived from the quantizing feedback circuit 12. The differential amplifier 43 compares the DC level detected by the first DC level detecting circuit 41 with the DC level detected by the second DC level detecting circuit 42 to thereby output a control signal defined by a difference in these detected DC levels.

The first DC level detecting circuit 41 is constituted by an amplitude detecting circuit 411 for detecting the amplitude of the output signal derived from the linear amplifier circuit 11; a low-pass filter (LPF) 412 for filtering the detected output signal from this amplitude detecting circuit 411 to derive a DC level; and an output transistor 413 for supplying the DC level extracted from this low-pass filter 412 to the differential amplifier 43 as a (+) input.

The second DC level detecting circuit 42 is constituted by an amplitude detecting circuit 421 for detecting the ampli-tude of the output signal derived from the quantizing feedback circuit 12; a low-pass filter (LPF) 422 for filtering the detected output signal from this amplitude detecting circuit 421 to derive a DC level; and an output transistor 423 for supplying the DC level extracted from this low-pass filter 422 to the differential amplifier 43 as a (−) input.

The AGC circuit 13 having the above-described circuit arrangement compares the input signal of the quantizing feedback circuit 12 with the DC level of the output signal thereof, and then supplies an output signal corresponding to a level difference between these signals to the base of the transistor Q7 of the comparator 23. As a result, as previously explained, the quantizing feedback circuit 12 performs the amplitude control of this output signal in such a manner that the current flowing through the variable current source 31 is varied in response to this control signal, and therefore, the amplitude of the output signal derived from the quantizing feedback circuit 12 is made coincident with the amplitude of the input signal thereof.

The AGC circuit 13 is further equipped with a compensation circuit 44. This compensation circuit 44 performs a compensation in order that when the DC levels of both the input signal and the output signal of the quantizing feedback circuit 12 are low, the control signal supplied to the base of the transistor Q7 of the comparator 23 is not brought into unstable condition. This compensation circuit 44 is operated to wait for such a condition that, for instance, when no input signal is entered, a small current flows through the variable current source 31 by applying a preselected DC level to the (−) input of the differential amplifier 43.

The compensation circuit 44 is arranged by a reference amplifier 441, an amplitude detecting circuit 442, a low-pass filter 443, and an output transistor 444. The reference amplifier 441 supplies, for example, a signal having an amplitude of 40 mVpp based upon a signal having a frequency of 300 MHz. The amplitude detecting circuit 442 detects an output amplitude of this reference amplifier 441. The low-pass filter 443 filters a detection output of this amplitude detecting circuit 442 to produce a DC level. The output transistor 444 supplies the DC level extracted by this low-pass filter 443 to the (−) input of the differential amplifier 43.

Figure 5:
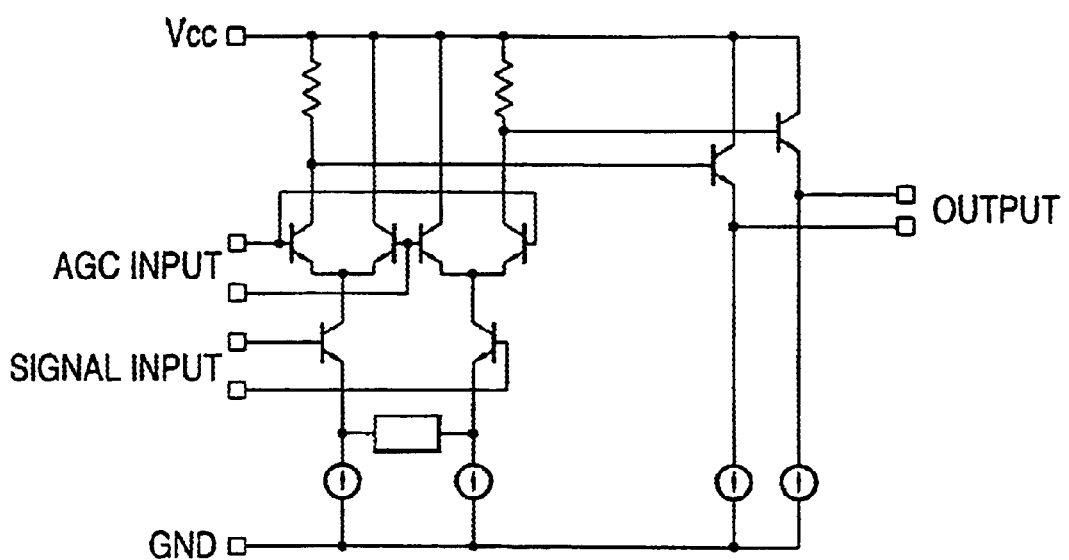
FIG. 5 is a circuit diagram for showing an example of a circuit arrangement of an input unit amplifier.

As previously explained, in the DC recovery circuit according to this embodiment, since the quantizing feedback circuit 12 is employed, the shift contained in the DC level of the input signal can be corrected, and also, the current of the variable current source 31 of the differential amplifier which constitutes the comparator 23 is controlled based on the control signal applied from the AGC circuit 13. Even when the input unit amplifier (see FIG. 5) constructed by longitudinally stacking the transistors is not employed, the amplitude of the input signal of the DC recovery circuit can be made coincident with the amplitude of the output signal, whereas such an input unit amplifier is employed in the conventional DC recovery circuit. As a consequence, even under the low power supply voltage (for example, 3.3 V), this DC recovery circuit can receive the ECL signal and also can correctly correct the DC level.

Further, in the DC recovery circuit with the above-described circuit arrangement, since the linear amplifier circuit 11 is arranged at the input stage so as to convert the amplitude of the input signal, even when such a digital signal is entered, namely the amplitude thereof is large such as 300 to 500 mVpp, and the DC level is shifted, this shifted DC level can be compensated.

It should also be noted that although the above-described concrete circuit arrangements of the respective arrangement portions employed in the respective embodiment modes have been disclosed, the present invention is not limited thereto.

As previously described in detail, in accordance with the present invention, in the DC recovery circuit capable of correcting the shift contained in the DC level of the digital signal entered via the capacitor coupling by using the quantizing feedback circuit, since the comparing means for constituting the quantizing feedback circuit is controlled, the amplitude of the output signal of this comparing means can be made coincident with the amplitude of the input signal thereof. As a consequence, even under low power supply voltage, the DC recovery circuit can receive the ECL signal and can correctly correct the DC level.

What is claimed is:

1. A DC recovery circuit comprising:
   adding means for inputting thereunto a digital signal entered via a capacitor coupling as one input of said adding means;
   comparing means for judging a logic state of an output signal of said adding means;
   extracting means for extracting a DC component of the output signal from said comparing means to enter the extracted DC component to another input of said adding means; and
   gain adjustable control means for adjustably controlling said comparing means in order that an amplitude of the output signal from said comparing means is made coincident with an amplitude of said one input signal of said adding means for operating at a low voltage operation level, wherein:
      said control means includes a first detecting circuit for detecting a DC component of said one input signal of said adding means, a second detecting circuit for detecting a DC component of the output signal of said comparing means, and a differential amplifier for comparing a detection level of said first detecting circuit with a detection level of said second detecting circuit so as to output a control signal in accordance with a difference calculated by the compared detection levels, and wherein:
         said control means controls the amplitude of the output signal from said comparing means in response to the control signal outputted from said differential amplifier, and wherein
            said comparing means is arranged by a differential amplifier structure, and a current of a current source contained in said differential amplifier is varied in response to said control signal.

2. A DC recovery circuit comprising:
   adding means for inputting thereunto a digital signal entered via a capacitor coupling as one input of said adding means;
   comparing means for judging a logic state of an output signal of by said adding means;
   extracting means for extracting a DC component of the output signal from said comparing means to enter the extracted DC component to another input of said adding means; and
   control means for controlling said comparing means in order that an amplitude of the output signal from said comparing means is made coincident with an amplitude of said one input signal of said adding means, wherein
   said control means includes a first detecting circuit for detecting a DC component of said one input signal of said adding means, a second detecting circuit for detecting a DC component of the output signal of said comparing means, and a differential amplifier for comparing a detection level of said first detecting circuit with a detection level of said second detecting circuit so as to output a control signal in accordance with a difference calculated by the compared detection levels, and wherein:
      said first and second detecting circuits are arranged by:
         an amplitude detecting circuit for detecting an amplitude of input signal inputted to said first and second detecting circuits.
         a low-pass filter for filtering the amplitude detected by said amplitude detecting circuit to produce a DC level; and
         an output transistor for entering the DC level extracted from said low-pass filter into the differential amplifier.

3. A DC recovery circuit as claimed in claim 2 wherein:
   said comparing means is arranged by a differential amplifier structure, and a current of a current source contained in said differential amplifier is varied in response to said control signal.

4. A DC recovery circuit as claimed in claim 2 wherein:
   said control means includes a compensation circuit for applying information used to output a predetermined control signal to said differential amplifier when said one input signal of said adding means and the output signal of said comparing means are small.

5. A DC recovery circuit comprising:
   adding means for inputting thereunto a digital signal entered via a capacitor coupling as one input of said adding means;
   comparing means for judging a logic state of an output signal of said adding means;
   extracting means for extracting a DC component of an output signal from said comparing means to enter the extracted DC component to another input of said adding means; and
   control means for controlling said comparing means in order that an amplitude of the output signal from said comparing means is made coincident with an amplitude of said one input signal of said adding means, wherein:
      said control means includes a first detecting circuit for detecting a DC component of said one input signal of said adding means, a second detecting circuit for detecting a DC component of the output signal of said comparing means, and a differential amplifier for comparing the detecting level of said first detecting circuit with the detection level of said second detecting circuit so as to output a control signal in accordance with a difference calculated by the detecting levels, and wherein:
         said control means controls the amplitude of the output signal from said comparing means in response to a control signal outputted from said differential amplifier, and wherein:
            said control means includes a compensation circuit for applying information used to output a predetermined control signal to said differential amplifier when said one input signal of said adding means and the output signal of said comparing means are small, wherein:
               said compensation circuit is arranged by:
                  a reference amplifier for applying a second predetermined signal based upon a first predetermined signal;

an amplitude detecting circuit for detecting an amplitude of said reference amplifier;

a low-pass filter for filtering the amplitude detected by said amplitude detecting circuit to produce a DC level; and an output transistor for entering a DC level extracted from said low-pass filter into the differential amplifier.

6. A DC recovery circuit comprising:

adding means for inputting thereinto a digital signal entered via a capacitor coupling manner as one input signal of said adding means;

comparing means for judging a logic state of an output signal of said adding means;

extracting means for extracting a DC component of the output signal from said comparing means to enter the extracted DC component as another input signal of said adding means; and control means for controlling said comparing means in order that an amplitude of the output signal from said comparing means is made coincident with an amplitude of said one input signal of said adding means, wherein:

said adding means includes:

first and second transistors (Q3, Q4) having collectors to which said one input signal having opposite phases is supplied;

a resistor connected between an emitter of said first transistor and an emitter of said second transistor; and first and second constant current sources connected between said emitters of the first and second transistors and the ground; wherein:

said another input signal is supplied to bases of said first and second transistors.

7. A DC recovery circuit comprising:

adding means for inputting thereinto a digital signal entered via a capacitor coupling as one input signal of said adding means;

comparing means for judging a logic state of an output signal of said adding means;

extracting means for extracting a DC component of an output signal from said comparing means to enter the extracted DC component as another input signal of said adding means; and control means for controlling said comparing means in order that an amplitude of an output signal from said comparing means is made coincident with an amplitude of said one input signal of said adding means, wherein said control means includes a first detecting circuit for detecting a DC component of said one input signal of said adding means, a second detecting circuit for detecting a DC component of the output signal of said comparing means, and a differential amplifier for comparing a detection level of said first detecting circuit with a detection level of said second detecting circuit so as to output a control signal in accordance with a difference calculated in the detection levels, and said control means controls the amplitude of the output signal from said comparing means in response to the control signal outputted from said differential amplifier wherein:

said adding means includes:

first and second transistors (Q3, Q4) having collectors to which said one input signal having opposite phases is supplied;

a resistor connected between an emitter of said first transistor and an emitter of said second transistor; and first and second constant current sources connected between said emitters of the first and second transistors and the ground; wherein:

said another input signal is supplied to bases of said first and second transistors.

8. A DC recovery circuit as claimed in claim 7 wherein:

said comparing means is comprised of:

a differentially-paired transistor constituted by third and fourth transistors whose emitters are commonly connected to each other;

second and third resistors provided between the respective collectors of said third and fourth transistors and a constant potential (Vcc);

a constant current source connected between the respective emitters of said third and fourth transistors and the ground; and a variable current source constituted by a transistor and a resistor, which are series-connected between the respective emitters of said third and fourth transistors and the ground; wherein:

said control signal is supplied to the base of said fifth transistor.

9. A DC recovery circuit as claimed in claim 7 wherein:

said comparing means is arranged by a differential amplifier structure, and a current of a current source contained in said differential amplifier is varied in response to said control signal.

10. A DC recovery circuit as claimed in claim 7 wherein:

said control means includes a compensation circuit for applying information used to output a predetermined control signal to said differential amplifier when said one input signal of said adding means and the output signal of said comparing means are small.

* * * * *